United States Patent
Matsushita et al.

(10) Patent No.: US 9,099,425 B2
(45) Date of Patent: Aug. 4, 2015

(54) SEMICONDUCTOR DEVICE AND METHOD FOR MANUFACTURING THE SAME

(71) Applicant: Kabushiki Kaisha Toshiba, Minato-ku (JP)

(72) Inventors: Keiichi Matsushita, Ota-ku (JP); Yo Sasaki, Saitama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/322,216

(22) Filed: Jul. 2, 2014

(65) Prior Publication Data
US 2015/0069597 A1    Mar. 12, 2015

(30) Foreign Application Priority Data
Sep. 9, 2013   (JP) .................................. 2013-186732

(51) Int. Cl.
*H01L 23/373*   (2006.01)
*H01L 23/00*   (2006.01)
(Continued)

(52) U.S. Cl.
CPC ............ *H01L 23/3736* (2013.01); *H01L 21/50* (2013.01); *H01L 23/10* (2013.01); *H01L 23/142* (2013.01); *H01L 23/4827* (2013.01); *H01L 24/05* (2013.01); *H01L 24/29* (2013.01); *H01L 24/32* (2013.01); *H01L 24/49* (2013.01); *H01L 24/83* (2013.01); *H01L 24/03* (2013.01); *H01L 24/27* (2013.01); *H01L 24/48* (2013.01); *H01L 2224/0346* (2013.01); *H01L 2224/04026* (2013.01); *H01L 2224/05073* (2013.01); *H01L 2224/05082* (2013.01); *H01L 2224/05083* (2013.01); *H01L 2224/05144* (2013.01); *H01L 2224/05155* (2013.01); *H01L 2224/05164* (2013.01); *H01L 2224/05166* (2013.01); *H01L 2224/05169* (2013.01); *H01L 2224/05647* (2013.01); *H01L 2224/2741* (2013.01); *H01L 2224/2743* (2013.01); *H01L 2224/29082* (2013.01); *H01L 2224/29083* (2013.01); *H01L 2224/29084* (2013.01); *H01L 2224/29111* (2013.01); *H01L 2224/29144* (2013.01);
(Continued)

(58) Field of Classification Search
CPC ........................... H01L 23/3736; H01L 24/05
See application file for complete search history.

(56) References Cited

U.S. PATENT DOCUMENTS

2006/0267218 A1 * 11/2006 Hozoji et al. ................. 257/782

FOREIGN PATENT DOCUMENTS

| JP | 2005-32834 | 2/2005 |
| --- | --- | --- |
| JP | 2014-53384 | 3/2014 |

*Primary Examiner* — Wael Fahmy
*Assistant Examiner* — Wasiul Haider
(74) *Attorney, Agent, or Firm* — Oblon, McClelland, Maier & Neustadt, L.L.P.

(57) ABSTRACT

According to one embodiment, a semiconductor device includes a semiconductor element, a mounting member including Cu, and a bonding layer provided between the semiconductor element and the mounting member. The bonding layer includes a first region including Ti and Cu, and a second region provided between the first region and the mounting member, and including Sn and Cu. A first position along the first direction is positioned between the semiconductor element and a second position along the first direction. The first position is where the composition ratio of Ti in the first region is 0.1 times a maximum value of the composition ratio of Ti. The second position is where the composition ratio of Sn in the second region is 0.1 times a maximum value of the composition ratio of Sn. A distance between the first position and the second position is not less than 0.1 micrometers.

20 Claims, 3 Drawing Sheets

(51) Int. Cl.
  H01L 23/10  (2006.01)
  H01L 23/482 (2006.01)
  H01L 21/50  (2006.01)
  H01L 23/14  (2006.01)
(52) U.S. Cl.
  CPC .......... *H01L2224/29147* (2013.01); *H01L 2224/29155* (2013.01); *H01L 2224/29164* (2013.01); *H01L 2224/29166* (2013.01); *H01L 2224/29169* (2013.01); *H01L 2224/32245* (2013.01); *H01L 2224/32501* (2013.01); *H01L 2224/73265* (2013.01); *H01L 2224/83192* (2013.01); *H01L 2224/83193* (2013.01); *H01L 2224/83203* (2013.01); *H01L 2224/83359* (2013.01); *H01L 2224/83379* (2013.01); *H01L 2224/83447* (2013.01); *H01L 2224/83825* (2013.01); *H01L 2224/85444* (2013.01); *H01L 2924/0105* (2013.01); *H01L 2924/01022* (2013.01); *H01L 2924/01028* (2013.01); *H01L 2924/01029* (2013.01); *H01L 2924/01046* (2013.01); *H01L 2924/01078* (2013.01); *H01L 2924/01079* (2013.01); *H01L 2924/1033* (2013.01); *H01L 2924/10272* (2013.01); *H01L 2924/10329* (2013.01); *H01L 2924/13064* (2013.01); *H01L 2924/13091* (2013.01); *H01L 2924/161* (2013.01); *H01L 2924/171* (2013.01); *H01L 2924/2064* (2013.01)

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2013-186732, filed on Sep. 9, 2013; the entire contents of which are incorporated herein by reference.

FIELD

Embodiments described herein relate generally to a semiconductor device and a method for manufacturing the same.

BACKGROUND

In a semiconductor device, a semiconductor element is bonded to a mounting member. It is desirable for the thermal resistance of the bond to be low to obtain good heat dissipation by efficiently conducting the heat of the semiconductor element to the mounting member. High productivity is desirable for such a semiconductor device.

DETAILED DESCRIPTION

According to one embodiment, a semiconductor device includes a semiconductor element, a mounting member including Cu, and a bonding layer provided between the semiconductor element and the mounting member. The bonding layer includes a first region including Ti and Cu, and a second region provided between the first region and the mounting member, and including Sn and Cu. A composition ratio of Ti in the first region decreases along a first direction from the semiconductor element toward the mounting member. A composition ratio of Sn in the second region decreases along a second direction opposite to the first direction. A first position along the first direction is positioned between the semiconductor element and a second position along the first direction. The first position is where the composition ratio of Ti in the first region is 0.1 times a maximum value of the composition ratio of Ti in the first region. The second position is where the composition ratio of Sn in the second region is 0.1 times a maximum value of the composition ratio of Sn in the second region. A distance between the first position and the second position is not less than 0.1 micrometers.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1A:
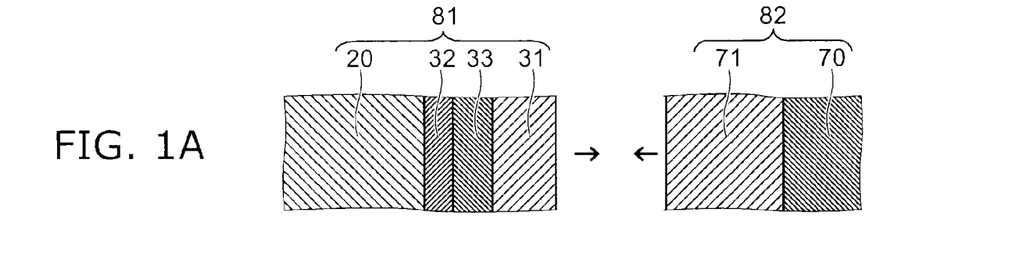
FIG. 1A to FIG. 1C are schematic views illustrating a semiconductor device according to a first embodiment.
Figure 1B:
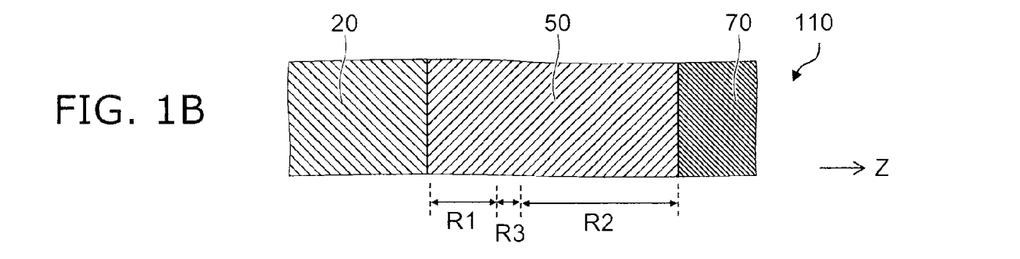
Figure 1C:
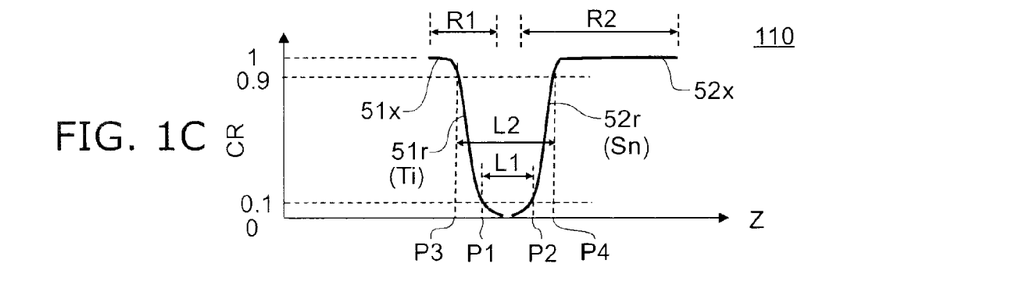

FIG. 1A to FIG. 1C are schematic views illustrating a semiconductor device according to a first embodiment.

FIG. 1A is a schematic cross-sectional view illustrating a portion of the manufacturing processes of the semiconductor device. FIG. 1B is a cross-sectional view of the semiconductor device. FIG. 1C is a graph illustrating the composition of the semiconductor device.

As shown in FIG. 1B, the semiconductor device 110 according to the embodiment includes a semiconductor element 20, a mounting member 70, and a bonding layer 50.

The semiconductor element 20 includes, for example, SiC, GaAs, GaN, etc. The semiconductor element 20 is, for example, a high frequency element. The semiconductor element 20 is, for example, a high output element. Examples of the semiconductor element 20 are described below.

The mounting member 70 includes Cu (copper). The mounting member 70 is, for example, a heat-dissipating member. For example, the mounting member 70 may be a portion of a container that contains the semiconductor element 20.

The bonding layer 50 is provided between the semiconductor element 20 and the mounting member 70. The bonding layer 50 is, for example, a solid solution of a metal including Cu.

A direction from the semiconductor element 20 toward the mounting member 70 is taken as a first direction (a Z-axis direction).

FIG. 1A illustrates a manufacturing process of the semiconductor device 110.

As shown in FIG. 1A, a first patterning body 81 and a second patterning body 82 are prepared. The first patterning body 81 includes the semiconductor element 20, a first film 31, and a second film 32. The first film 31 includes Cu. The second film 32 is provided between the semiconductor element 20 and the first film 31 and includes Ti (titanium). In the example, the first patterning body 81 further includes a third film 33. The third film 33 is provided between the first film 31 and the second film 32. The third film 33 includes, for example, Au (gold). The third film 33 may be provided if necessary and may be omitted in some cases.

For example, SiC is used as the portion of the semiconductor element 20 facing the second film 32. For example, a Ti film is used as the second film 32. The thickness of the second film 32 is, for example, about 0.02 micrometers (μm). For example, a Au film is used as the third film 33. The thickness of the third film 33 is, for example, about 3 μm. For example, a Cu film is used as the first film 31. The thickness of the first film 31 is, for example, about 1 μm.

The second film 32, the third film 33, and the first film 31 are formed by, for example, plating.

The second patterning body 82 includes the mounting member 70 and a mounting member-side film 71. The mounting member-side film 71 is stacked with the mounting member 70. The mounting member-side film 71 includes Sn (tin). For example, a Sn film is used as the mounting member-side film 71. The thickness of the mounting member-side film 71 is, for example, about 3 µm. The mounting member-side film 71 is formed by, for example, liquid phase diffusion bonding.

Such a first patterning body 81 is caused to oppose such a second patterning body 82. At this time, the first film 31 is caused to oppose the mounting member-side film 71. Then, the first film 31 is caused to approach the mounting member-side film 71; and, for example, the first film 31 is caused to contact the mounting member-side film 71. Heating is performed in this state. The heating is performed while pressing the first patterning body 81 and the second patterning body 82. Thereby, the semiconductor element 20 is bonded to the mounting member 70. The bonding is, for example, solid solution bonding. Thereby, the bonding layer 50 is formed to be provided between the semiconductor element 20 and the mounting member 70. The bonding layer 50 is formed of the second film 32, the third film 33, the first film 31, and the mounting member-side film 71. Thereby, the semiconductor device 110 is formed.

The bonding layer 50 is a solid solution including the elements included in these films. Concentration distributions, i.e., composition distributions, of the elements are formed in the bonding layer 50.

An example of the composition distribution of the bonding layer 50 will now be described.

As shown in FIG. 1B, the bonding layer 50 includes a first region R1 and a second region R2. The second region R2 is provided between the first region R1 and the mounting member 70. The composition ratios of these regions are different from each other. In the example, a third region R3 is further provided between the first region R1 and the second region R2.

The first region R1 is a region including Ti. The first region R1 may further include Cu. The first region R1 may further include Au.

The second region R2 is a region including Sn. The second region R2 may further include Cu. The second region R2 may further include Au.

FIG. 1C illustrates the composition of the bonding layer 50 of the semiconductor device 110. The horizontal axis of FIG. 1C is the position in the Z-axis direction. The vertical axis is a composition ratio CR of Ti or Sn. The composition ratio CR is schematically illustrated with a maximum value of 1 for the compositions of Ti and Sn.

As shown in FIG. 1C, a composition ratio $51r$ of Ti in the first region R1 decreases along the Z-axis direction (the first direction from the semiconductor element 20 toward the mounting member 70). The distribution of Ti in the first region R1 is formed by, for example, diffusion of the Ti included in the second film 32 (the Ti film).

On the other hand, a composition ratio $52r$ of Sn in the second region R2 decreases along a second direction that is opposite to the Z-axis direction (the first direction). The distribution of Sn in the second region R2 is formed by diffusion of the Sn included in the mounting member-side film 71 (the Sn film).

In the embodiment, a region where both Ti and Sn exist substantially is not formed inside the bonding layer 50.

For example, the position along the first direction where the composition ratio $51r$ of Ti in the first region R1 is 0.1 times a maximum value $51x$ of the composition ratio $51r$ of Ti in the first region R1 is referred to as a first position P1. The position along the first direction where the composition ratio $52r$ of Sn in the second region R2 is 0.1 times a maximum value $52x$ of the composition ratio $52r$ of Sn in the second region R2 is referred to as a second position P2.

The first position P1 is positioned between the second position P2 and the semiconductor element 20. The distance (a first distance L1) between the first position P1 and the second position P2 is 0.1 µm or more.

The first position P1 where the composition ratio $51r$ of Ti is 10% of the maximum value $51x$ is not less than 0.1 µm away from the second position P2 where the composition ratio $52r$ of Sn is 10% of the maximum value $52x$. Thereby, Ti and Sn substantially do not exist in the same region. For example, Ti substantially does not exist in a region where Sn exists.

Thereby, a semiconductor device having good heat dissipation and high productivity can be provided.

Figure 2:
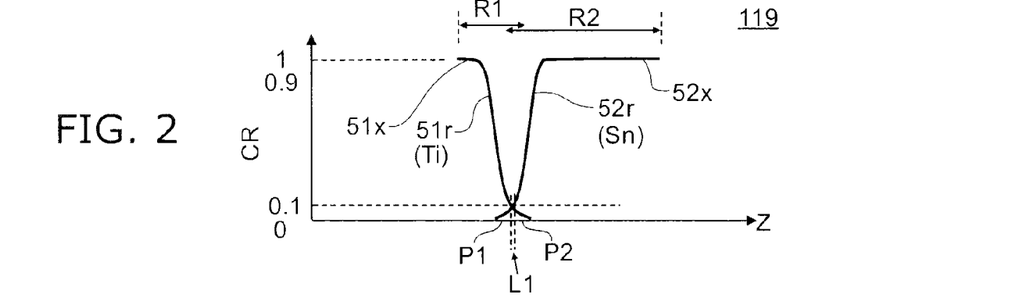
FIG. 2 is a schematic cross-sectional view illustrating a semiconductor device of a reference example.

FIG. 2 is a schematic cross-sectional view illustrating a semiconductor device of a reference example.

FIG. 2 illustrates the composition of the bonding layer of the semiconductor device 119 (having a not-shown configuration) of the reference example. The semiconductor device 119 also includes the semiconductor element 20, the mounting member 70, and the bonding layer 50. The composition distribution of the bonding layer 50 of the semiconductor device 119 is different from that of the semiconductor device 110.

In the semiconductor device 119 as shown in FIG. 2, a region where both Ti and Sn exist is formed inside the bonding layer 50. In the semiconductor device 119, the distance (the first distance L1) between the first position P1 and the second position P2 is less than 0.1 µm. Or, the second position P2 is positioned between the first position P1 and the semiconductor element 20.

It became apparent from experiments of the inventor that peeling occurs in the bonding layer 50 of such a semiconductor device 119. The experiments will now be described.

In the experiments, the semiconductor device 119 is made using the first patterning body 81 and the second patterning body 82 recited above. SiC is used as the semiconductor element 20 of the first patterning body 81. A Ti film is used as the second film 32. A Au film is used as the third film 33. A Cu film is used as the first film 31. On the other hand, Cu is used as the mounting member 70 of the second patterning body 82. A Sn film is used as the mounting member-side film 71. The bonding layer 50 is formed by causing the first film 31 to oppose the mounting member-side film 71, pressing, and performing heating at 260° C. to bond. Thus, the semiconductor device 119 is formed.

After being formed, the semiconductor device 119 is subjected to heating processes (reheating processes). For example, the semiconductor device 119 is reheated in processes in which the semiconductor device 119 is disposed and sealed inside a housing, processes of providing interconnects, etc. For example, Au—Sn solder is used in such reheating processes. The melting point of Au—Sn solder is about 300° C.; and therefore, the temperature of the reheating processes is about 300° C. or more. It was found that there are cases where peeling occurs in the bonding layer 50 after being subjected to such reheating processes. Due to the peeling, the yield decreases; and the productivity is low.

By analyzing the semiconductor device 119 in which the peeling occurs, it was found that a region including Ti and Sn is formed in the bonding layer 50.

Figure 3:
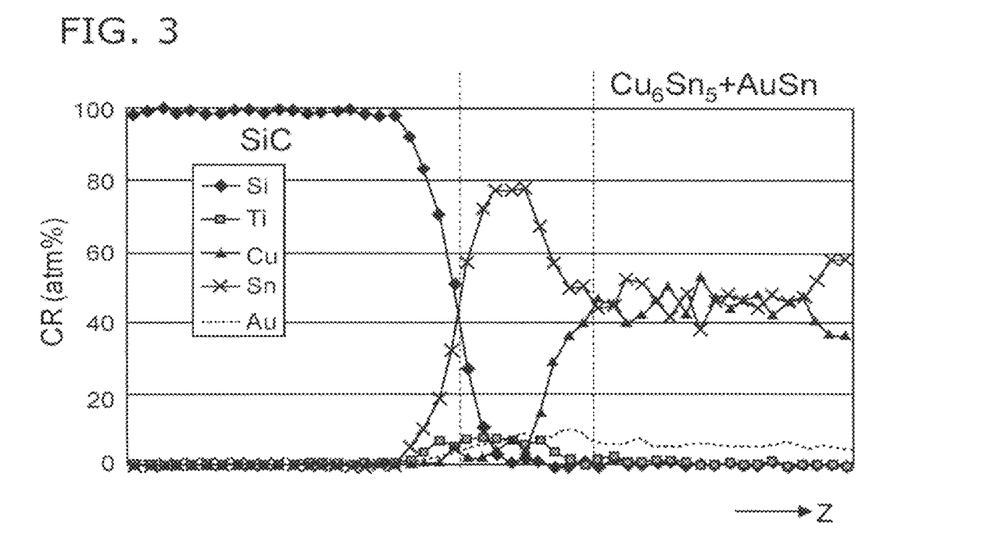
FIG. 3 is a schematic view illustrating the semiconductor device of the reference example.

FIG. 3 is a schematic view illustrating the semiconductor device of the reference example.

FIG. 3 shows analysis results of the composition of the semiconductor device 119 by EDX (energy dispersive X-ray spectrometry).

In FIG. 3, the horizontal axis is the Z-axis direction position. The vertical axis is the composition ratio CR (atomic percent (atm %)). It can be seen from FIG. 3 that a region including Ti and Sn is formed in the bonding layer 50.

Based on the Cu—Sn—Ti ternary phase diagram, a liquid phase and a Sn—Ti compound (e.g., a $Sn_3Ti_2$ compound) coexist for a Sn-rich layer. Therefore, it is considered that the Sn-rich layer melts when heating at 300° C. in the reheating processes; and the peeling occurs when cooling. In particular, the wettability is poor between the melting surface and the surface of the SiC. Therefore, it is considered that the peeling occurs easily in this portion (the interface between the SiC and the Sn-rich layer). On the other hand, Au—Cu—Sn does not melt at 300° C. Thus, it is considered that the melting point decreases and the peeling thereby occurs in the case where Ti exists in the region where Sn exists.

In the embodiment, a region where both Ti and Sn exist substantially is not formed inside the bonding layer 50. Specifically, the first distance L1 is set to be 0.1 μm or more. Thereby, the peeling can be suppressed.

In the semiconductor device 110 according to the embodiment, for example, the thickness of the first film 31 of the first patterning body 81 is set to be thicker than the value (1 μm) of the semiconductor device 119 of the reference example. For example, the thickness of the first film 31 of the semiconductor device 110 is set to be 2 p.m. Thereby, the first distance L1 can be 0.1 μm or more.

In the case where the third film 33 (e.g., the Au film) is provided in the embodiment, the thickness of the Au film may be thick. Thereby, the first distance L1 can be 0.1 μm or more.

It can be seen from the analysis results of FIG. 3 that the distance that the Ti diffuses is about 2.2 μm. On the other hand, the distance that the Sn diffuses is about 1.5 μm. Therefore, it is favorable for the distance between the Ti film and the Sn film to be not less than the total of these distances.

For example, as shown in FIG. 1C, the position along the first direction where the composition ratio 51r of Ti in the first region R1 is 0.9 times the maximum value 51x of the composition ratio 51r of Ti in the first region R1 is referred to as a third position P3. The position along the first direction where the composition ratio 52r of Sn in the second region R2 is 0.9 times the maximum value 52x of the composition ratio 52r of Sn in the second region R2 is referred to as a fourth position P4. The distance (a second distance L2) between the third position P3 and the fourth position P4 is set to be not less than 3.7 μm. Thereby, it is easier for the distance (the first distance L1) between the first position P1 and the second position P2 to be 0.1 μm or more. Thereby, a region where both Ti and Sn exist substantially is not formed inside the bonding layer 50.

As described above, the third film 33 (e.g., the Au film) may be provided in the semiconductor device 110. In such a case, the first region R1 may further include Au in addition to Ti and Cu. Also, the second region R2 may further include Au in addition to Sn and Cu.

Second Embodiment

Figure 4A:
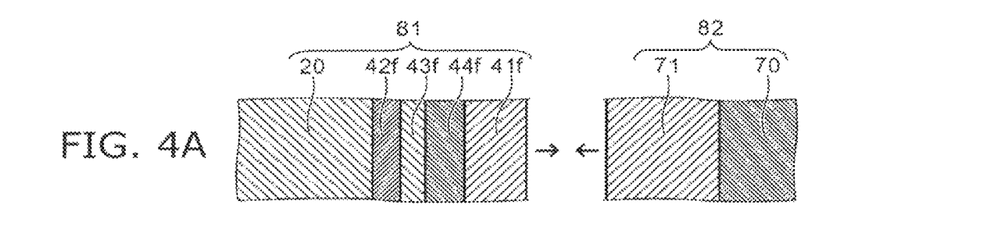
FIG. 4A and FIG. 4B are schematic views illustrating a semiconductor device according to a second embodiment.
Figure 4B:
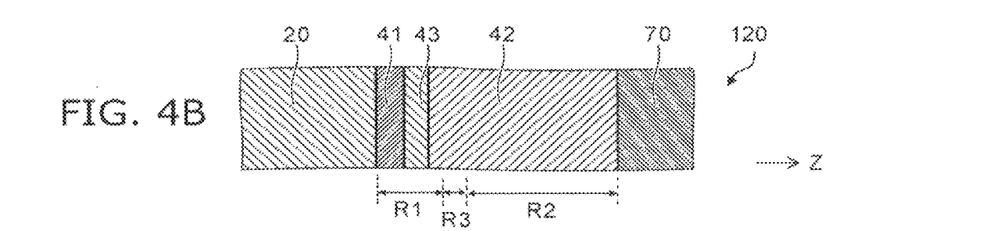

FIG. 4A and FIG. 4B are schematic views illustrating a semiconductor device according to a second embodiment.

FIG. 4A is a schematic cross-sectional view illustrating a portion of the manufacturing processes of the semiconductor device. FIG. 4B is a cross-sectional view of the semiconductor device.

As shown in FIG. 4B, the semiconductor device 120 according to the embodiment includes the semiconductor element 20, the mounting member 70, a first layer 41, a second layer 42, and a third layer 43. The mounting member 70 includes Cu.

The first layer 41 is provided between the semiconductor element 20 and the mounting member 70 and includes Ti. The second layer 42 is provided between the first layer 41 and the mounting member 70 and includes Sn and Cu. The third layer 43 is provided between the first layer 41 and the second layer 42 and includes at least one selected from Ni, Pt, and Pd. In the example, the second layer 42 further includes Au.

For example, a Ti film is used as the first layer 41. The thickness of the first layer 41 is, for example, not less than 0.005 μm and not more than 0.05 μm. For example, an alloy film including Sn, Au, and Cu is used as the second layer 42. The thickness of the second layer 42 is, for example, not less than 0.1 μm and not more than 100 μm. For example, a Ni film is used as the third layer 43. The thickness of the third layer 43 is, for example, not less than 0.1 μm and not more than 10 μm.

FIG. 4A illustrates a manufacturing process of the semiconductor device 120.

As shown in FIG. 4A, the first patterning body 81 and the second patterning body 82 are prepared. The first patterning body 81 includes the semiconductor element 20, a first element-side film 41f, a second element-side film 42f, and a third element-side film 43f. In the example, a fourth element-side film 44f is further provided.

The first element-side film 41f includes Cu. The second element-side film 42f is provided between the semiconductor element 20 and the first element-side film 41f and includes Ti. The third element-side film 43f is provided between the first element-side film 41f and the second element-side film 42f and includes at least one selected from Ni (nickel), Pt (platinum), and Pd (palladium). The fourth element-side film 44f is provided between the first element-side film 41f and the third element-side film 43f.

For example, a Cu film having a thickness not less than 2 μm and not more than 100 μm is used as the first element-side film 41f.

For example, a Ti film having a thickness not less than 0.005 μm and not more than 0.05 μm is used as the second element-side film 42f.

For example, a Ni film having a thickness not less than 0.1 μm and not more than 2 μm is used as the third element-side film 43f.

For example, a Au film having a thickness not less than 0.1 μm and not more than 10 μm is used as the fourth element-side film 44f.

The second element-side film 42f, the third element-side film 43f, the fourth element-side film 44f, and the first element-side film 41f are formed by, for example, plating.

In the example as well, for example, SiC is used as the portion of the semiconductor element 20 facing the second element-side film 42f.

The second patterning body 82 includes the mounting member 70 and the mounting member-side film 71. The mounting member-side film 71 is stacked with the mounting member 70. In the example as well, the mounting member-side film 71 includes Sn.

Such a first patterning body 81 is caused to oppose such a second patterning body 82. In other words, the first element-side film 41f is caused to oppose the mounting member-side film 71. For example, the first element-side film 41f is caused to contact the mounting member-side film 71. Heating is performed in this state. The heating is performed while pressing the first patterning body 81 and the second patterning body 82. Thereby, the semiconductor element 20 is bonded to the mounting member 70. The bonding is, for example, solid solution bonding. Thereby, the bonding layer (the second layer 42) that is provided between the semiconductor element 20 and the mounting member 70 is formed. Thereby, the semiconductor device 120 is formed.

In the semiconductor device 120 that is manufactured by the manufacturing method, the first layer 41 is formed from the second element-side film 42f. The third layer 43 is formed from the third element-side film 43f. The second layer 42 (the bonding layer) is formed from the fourth element-side film 44f, the first element-side film 41f, and the mounting member-side film 71.

In the semiconductor device 120 according to the embodiment, the third layer 43 (e.g., the Ni layer) suppresses the diffusion of Ti from the first layer 41 into the second layer 42. The second layer 42 substantially does not include Ti. Thus, due to the third layer 43 in the semiconductor device 120, a region where both Ti and Sn exist substantially is not formed.

In the embodiment as well, a semiconductor device having good heat dissipation and high productivity is provided.

Examples of the semiconductor devices according to the first and second embodiments will now be described in more detail. An example of the semiconductor device 110 will now be described.

For example, one selected from a GaAs FET (Field Effect Transistor), a GaAs HEMT (High Electron Mobility Transistor), a gallium nitride semiconductor element, and a silicon carbide semiconductor element is provided as the semiconductor device 110. In the following example, a GaAs semiconductor element is provided.

Figure 5A:
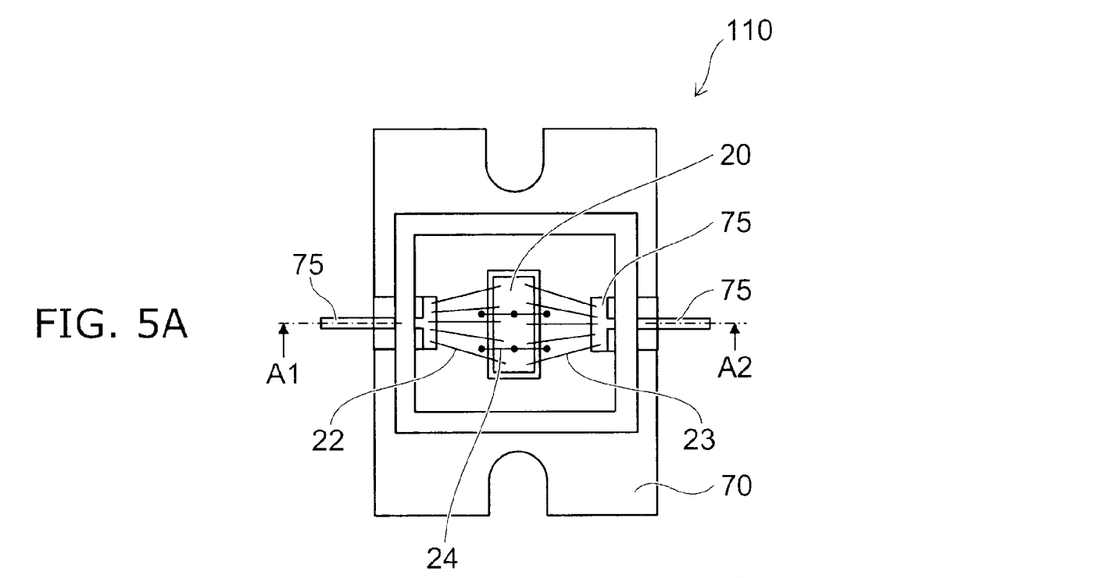
FIGS. 5A and 5B are schematic views illustrating the semiconductor device according to the embodiment.
Figure 5B:
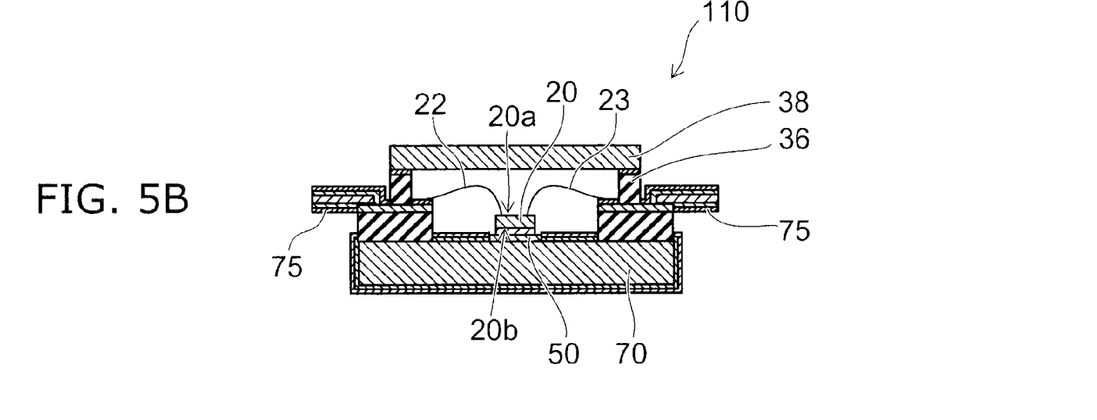

FIG. 5A and FIG. 5B are schematic views illustrating the semiconductor device according to the embodiment.

FIG. 5A is a plan view. FIG. 5B is a cross-sectional view along line A1-A2 of FIG. 5A. However, a lid 38 and a frame 36 that are illustrated in FIG. 5B are not shown in FIG. 5A.

As shown in FIG. 5B, the semiconductor element 20 has a first surface 20a, and a second surface 20b on the side opposite to the first surface 20a. The first surface 20a has an active region including a drain, a gate, a source, etc.

The semiconductor element 20 is provided on the mounting member 70. The second surface 20b of the semiconductor element 20 opposes the mounting member 70. The bonding layer 50 is provided between the second surface 20b and the mounting member 70.

The frame 36 is provided around the semiconductor element 20 on the mounting member 70.

The gate electrode of the semiconductor element 20 is connected to a portion of an interconnect unit 75 via a bonding wire 22. The drain electrode is connected to another portion of the interconnect unit 75 via a bonding wire 23. The source electrode is electrically connected to the mounting member 70 by a bonding wire 24. For example, a gold layer is used at the surface of the mounting member 70 in the region where the wire bonding is performed. Thereby, for example, a high wire bonding strength is obtained.

The lid 38 is provided above the semiconductor element 20 and is bonded to the frame 36. The semiconductor element 20 can be sealed airtightly by bonding the lid 38 to the frame 36.

For example, the semiconductor element 20 is bonded to the upper surface of the mounting member 70 to form the bonding layer 50. Subsequently, the lid 38 is bonded. The bonding layer 50 is heated to a high temperature in the bonding of the lid 38. At this time, the first position P1 of the bonding layer 50 is positioned between the second position P2 and the semiconductor element 20 in the semiconductor device 110. Also, the distance (the first distance L1) between the first position P1 and the second position P2 is set to be 0.1 μm or more. Thereby, a region where both Ti and Sn exist substantially is not formed inside the bonding layer 50. Thereby, a semiconductor device having good heat dissipation and high productivity can be provided.

In the semiconductor device 120 according to the second embodiment, the first layer 41 (e.g., the Ti layer), the third layer 43 (e.g., the Ni layer), and the second layer 42 (e.g., the layer including Sn and Cu) are provided at the position of the bonding layer 50 of FIG. 5B. By providing the third layer 43 (e.g., the Ni layer) in the semiconductor device 120 according to the second embodiment, the diffusion of the Ti is suppressed by the third layer 43 even when subjected to the high temperature of the bonding of the lid 38. Thereby, a region where both Ti and Sn exist substantially is not formed in the second layer 42. Thereby, a semiconductor device having good heat dissipation and high productivity can be provided.

Third Embodiment

Figure 6:
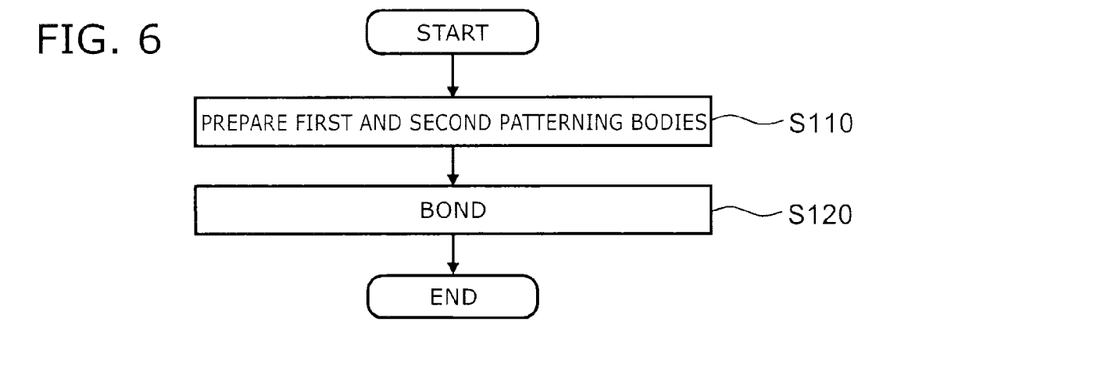
FIG. 6 is a flowchart illustrating a method for manufacturing a semiconductor device according to a third embodiment.

FIG. 6 is a flowchart illustrating a method for manufacturing a semiconductor device according to a third embodiment.

In the manufacturing method as shown in FIG. 6, the first patterning body 81 and the second patterning body 82 are prepared (step S110). The first patterning body 81 includes the semiconductor element 20, the first film 31 including Cu, and the second film 32 including Ti provided between the semiconductor element 20 and the first film 31. The second patterning body 82 includes the mounting member 70 including Cu, and the mounting member-side film 71 including Sn stacked with the mounting member 70.

In the manufacturing method, the semiconductor element 20 and the mounting member 70 are bonded by causing the first film 31 to oppose the mounting member-side film 71 and by heating (step S120). Thereby, the bonding layer 50 is formed to be provided between the semiconductor element 20 and the mounting member 70. Thereby, the semiconductor device 110 that includes the semiconductor element 20, the mounting member 70, and the bonding layer 50 is formed.

The bonding layer 50 has the first region R1 including Ti and Cu, and the second region R2 including Sn and Cu provided between the first region R1 and the mounting member 70. The first position P1 recited above is positioned between the second position P2 recited above and the semiconductor element 20. The distance between the first position P1 and the second position P2 is set to be 0.1 μm or more.

According to the manufacturing method according to the embodiment, a semiconductor device having good heat dissipation and high productivity can be provided.

Fourth Embodiment

The embodiment relates to a method for manufacturing the semiconductor device 120 described in regard to the second embodiment. The manufacturing method according to the embodiment may be similar to FIG. 6; and a flowchart is therefore not-shown.

In the manufacturing method according to the embodiment as well, the first patterning body 81 and the second patterning body 82 are prepared (step S110). The first patterning body 81 includes the semiconductor element 20, the first element-side film 41f including Cu, the second element-side film 42f including Ti provided between the semiconductor element 20 and the first element-side film 41f, and the third element-side film 43f including at least one selected from Ni, Pt, and Pd provided between the first element-side film 41f and the second element-side film 42f. The second patterning body 82 includes the mounting member including Cu, and the mounting member-side film 71 including Sn stacked with the mounting member 70.

In the manufacturing method, the semiconductor element 20 is bonded to the mounting member 70 by causing the first element-side film 41f to oppose the mounting member-side film 71 and by heating (step S120). Thereby, the semiconductor device that includes the semiconductor element 20, the mounting member 70, and the bonding layer (e.g., the second layer 42) provided between the semiconductor element 20 and the mounting member 70 can be formed.

According to the embodiments, a semiconductor device having good heat dissipation and high productivity and a method for manufacturing the semiconductor device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in the semiconductor device such as the semiconductor element, the mounting member, the bonding layer, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all semiconductor devices and methods for manufacturing semiconductor devices practicable by an appropriate design modification by one skilled in the art based on the semiconductor devices and the methods for manufacturing the semiconductor devices described above as embodiments of the invention also are within the scope of the invention to the extent that the spirit of the invention is included.

Further, any two or more components of the specific examples may be combined within the extent of technical feasibility and are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor element;
   a mounting member including Cu; and
   a bonding layer provided between the semiconductor element and the mounting member,
   the bonding layer including:
      a first region including Ti and Cu; and
      a second region provided between the first region and the mounting member, the second region including Sn and Cu,
   a composition ratio of Ti in the first region decreasing along a first direction from the semiconductor element toward the mounting member,
   a composition ratio of Sn in the second region decreasing along a second direction opposite to the first direction,
   a first position along the first direction being positioned between the semiconductor element and a second position along the first direction, the first position being where the composition ratio of Ti in the first region is 0.1 times a maximum value of the composition ratio of Ti in the first region, the second position being where the composition ratio of Sn in the second region is 0.1 times a maximum value of the composition ratio of Sn in the second region,
   a distance between the first position and the second position being not less than 0.1 micrometers.

2. The device according to claim 1, wherein a distance between a third position along the first direction and a fourth position along the first direction is not less than 3.7 micrometers, the third position being where the composition ratio of Ti in the first region is 0.9 times the maximum value of the composition ratio of Ti in the first region, the fourth position being where the composition ratio of Sn in the second region is 0.9 times the maximum value of the composition ratio of Sn in the second region.

3. The device according to claim 1, wherein the first region further includes Au.

4. The device according to claim 1, wherein the second region further includes Au.

5. The device according to claim 1, wherein the mounting member has a surface on which a wire is bonded, the surface of the mounting member includes a gold.

6. A semiconductor device, comprising:
   a semiconductor element;
   a mounting member including Cu;
   a first layer provided between the semiconductor element and the mounting member, the first layer including Ti;
   a second layer provided between the first layer and the mounting member, the second layer including Sn and Cu; and
   a third layer provided between the first layer and the second layer, the third layer including at least one selected from Ni, Pt, and Pd.

7. The device according to claim 6, wherein the second layer further includes Au.

8. The device according to claim 6, wherein a thickness of the first layer is not less than 0.005 micrometers and not more than 0.05 micrometers.

9. The device according to claim 6, wherein a thickness of the second layer is not less than 0.1 micrometers and not more than 100 micrometers.

10. The device according to claim 6, wherein a thickness of the third layer is not less than 0.1 micrometers and not more than 10 micrometers.

11. A method for manufacturing a semiconductor device including a semiconductor element, a mounting member, and a bonding layer, the method comprising:
   preparing a first patterning body and a second patterning body, the first patterning body including the semiconductor element, a first film, and a second film, the first film including Cu, the second film being provided between the semiconductor element and the first film and including Ti, the second patterning body including the mounting member and a mounting member-side film, the mounting member including Cu, the mounting member-side film being stacked with the mounting member and including Sn; and
   forming the bonding layer by causing the first film to oppose the mounting member-side film and by heating to bond the semiconductor element to the mounting member, the bonding layer being provided between the semiconductor element and the mounting member,
the bonding layer including:
a first region including Ti and Cu; and
a second region provided between the first region and the mounting member, the second region including Sn and Cu,
a composition ratio of Ti in the first region decreasing along the first direction from the semiconductor element toward the mounting member,
a composition ratio of Sn in the second region decreasing along the second direction opposite to the first direction,
a first position along the first direction being positioned between the semiconductor element and a second position along the first direction, the first position being where the composition ratio of Ti in the first region is 0.1 times a maximum value of the composition ratio of Ti in the first region, the second position being where the composition ratio of Sn in the second region is 0.1 times a maximum value of the composition ratio of Sn in the second region,
a distance between the first position and the second position being not less than 0.1 micrometers.

12. The method according to claim 11, wherein the first region further includes Au.

13. The method according to claim 11, wherein the second region further includes Au.

14. A method for manufacturing a semiconductor device including a semiconductor element, a mounting member, and a bonding layer, the bonding layer being provided between the semiconductor element and the mounting member, the method comprising:
preparing a first patterning body and a second patterning body, the first patterning body including the semiconductor element, a first element-side film, a second element-side film, and a third element-side film, the first element-side film including Cu, the second element-side film being provided between the semiconductor element and the first element-side film and including Ti, the third element-side film being provided between the first element-side film and the second element-side film and including at least one selected from Ni, Pt, and Pd, the second patterning body including the mounting member and a mounting member-side film, the mounting member including Cu, the mounting member-side film being stacked with the mounting member and including Sn; and
bonding the semiconductor element to the mounting member by causing the first element-side film to oppose the mounting member-side film and by heating.

15. The method according to claim 14, wherein the first patterning body further includes a fourth element side film provided between the first element side film and the third element side film.

16. The method according to claim 14, wherein a thickness of the first element-side film is not less than 2 micrometers and not more than 100 micrometers.

17. The method according to claim 14, wherein a thickness of the second element-side film is not less than 0.005 micrometers and not more than 0.05 micrometers.

18. The method according to claim 14, wherein a thickness of the third element-side film is not less than 0.1 micrometers and not more than 2 micrometers.

19. The method according to claim 15, wherein the fourth element-side film includes Au.

20. The method according to claim 15, wherein a thickness of the fourth element-side film is not less than 0.1 micrometers and not more than 10 micrometers.

\* \* \* \* \*